United States Patent [19]

Westerkamp

[11] Patent Number: 5,656,854
[45] Date of Patent: Aug. 12, 1997

[54] LEAD FRAME FOR A MULTIPLICITY OF TERMINALS

[75] Inventor: Hugo Westerkamp, Wolfenbuettel-Salzdahlum, Germany

[73] Assignee: LSI Logic Products GmbH, Brunswick, Germany

[21] Appl. No.: 554,967

[22] Filed: Nov. 13, 1995

Related U.S. Application Data

[62] Division of Ser. No. 375,273, Jan. 19, 1995, Pat. No. 5,466,967, which is a continuation of Ser. No. 141,986, Oct. 28, 1993, abandoned, which is a continuation of Ser. No. 952,473, Sep. 28, 1992, Pat. No. 5,270,570, which is a continuation of Ser. No. 626,720, Dec. 17, 1990, abandoned, which is a continuation-in-part of Ser. No. 419,168, Oct. 10, 1989, abandoned.

[30] Foreign Application Priority Data

Oct. 10, 1988 [DE] Germany ............ 38 34 361.4

[51] Int. Cl.⁶ .................................................. H01L 23/495
[52] U.S. Cl. ........................................... 257/666; 257/775
[58] Field of Search .............................. 257/666, 775, 257/669, 676, 672, 674

[56] References Cited

U.S. PATENT DOCUMENTS

| | | | |
|---|---|---|---|
| 3,842,492 | 10/1974 | Kamerbeek et al. | 29/588 |
| 3,906,621 | 9/1975 | Epple | 29/591 |
| 4,403,134 | 9/1983 | Klingel | 219/121 |
| 4,405,875 | 9/1983 | Nagai | 310/344 |
| 4,514,750 | 4/1985 | Adams | 357/70 |
| 4,529,958 | 7/1985 | Person et al. | 338/275 |
| 4,711,700 | 12/1987 | Cusack | 257/666 |
| 4,733,292 | 3/1988 | Jarvis | 357/70 |
| 4,872,260 | 10/1989 | Johnson et al. | 257/666 |
| 5,034,591 | 7/1991 | Fang | 219/121.69 |
| 5,270,570 | 12/1993 | Westerkamp | 257/666 |
| 5,466,967 | 11/1995 | Westerkamp | 257/666 |

FOREIGN PATENT DOCUMENTS

| | | |
|---|---|---|
| 0 213 764 | 3/1987 | European Pat. Off. . |
| 0 247 775 | 12/1987 | European Pat. Off. . |
| 0 321 326 | 6/1989 | European Pat. Off. . |
| 31 10 235 | 10/1982 | Germany . |
| 35 17 438 | 12/1985 | Germany . |
| 36 08 410 | 9/1987 | Germany . |

*Primary Examiner*—Mahshid D. Saadat
*Assistant Examiner*—S. V. Clark
*Attorney, Agent, or Firm*—Foley & Lardner

[57] ABSTRACT

A lead frame for a multiplicity of terminals, in particular of large-scale integrated semiconductor chips, arranged in a very confined space and consisting of metallic conductors which converge from large outer spacings toward the terminals and can be connected to the terminals. The lead frame allows a high number of terminals with a low degree of spacing of the conductors to be produced. The conductors are produced in the outer region by a conventional production method and at their ends pointing toward the terminals by laser cutting of a uniformly metallic material.

12 Claims, 2 Drawing Sheets

LEAD FRAME FOR A MULTIPLICITY OF TERMINALS

This application is a divisional application of application Ser. No. 08/375,273, filed Jan. 19, 1995; now U.S. Pat. No. 5,466,967, which is a continuation of Ser. No. 08/141,986, filed Oct. 28, 1993, now abandoned; which is a continuation of Ser. No. 07/952,473, filed Sep. 28, 1992, issued as U.S. Pat. No. 5,270,570; which is a continuation of Ser. No. 07/626,720, filed Dec. 17, 1990, now abandoned; which is a continuation-in-part of Ser. No. 07/419,168, filed Oct. 10, 1989, now abandoned.

BACKGROUND OF THE INVENTION

1. Field of the Invention

The present invention relates to a lead frame for a multiplicity of terminals, in particular of large-scale integrated semiconductor chips, arranged in a very confined space and consisting of metallic conductors, which converge from large outer spacings toward the terminals and can be connected to the terminals.

2. Discussion of Related Art

Such lead frames are used for contacting one or more large-scale integrated semiconductor chips. On their outer edge, the semiconductor chips have bonding pads which, according to the current technique, are square and have an edge length of 90 mm–120 mm and a spacing from pad to pad of at least 30 mm. The contact to the inner ends of the conductors of the lead frames is usually established by bonding wires having a diameter of 25 mm–30 mm.

The lead frames are usually produced with outer edge pieces which are parted or separated after positioning of the lead frame, so that the individual conductors of the lead frame are no longer electrically connected to one another.

Punching is the least expensive method available for the production of the lead frames. Due to the relatively high tool costs, this production method is not flexible. For relatively high numbers of terminals, the complexity of the tools increases, with the result that problems of precision multiply. Therefore, this technique is used to realize terminal numbers up to about 120.

Another known method of producing these frames is etching, by which the desired structures are etched out of a uniform metallic surface, so that the desired metallic conductors remain. The etching operation can be controlled in the usual way by photographic shadowing methods. Although this method is distinguished by low tool costs and by high flexibility, it leads to relatively high production costs because automation has not yet succeeded on an economically significant scale.

Both methods lead to a minimal terminal width and to a minimal clearance spacing between the terminals of the conductors on an order of magnitude of the material thickness, which is, for example, 150 mm. The minimal terminal width of 150 mm and the minimal spacing of likewise 150 mm leads to a terminal grid of 300 mm. On account of the limited length of the bonding wires, according to known techniques, a number of terminals of up to 160 can be achieved with a square package of 28 mm edge length (EIAJ Standard). Higher numbers of terminals can be achieved only by expensive special package configurations. These special packages, so-called arrays, have the disadvantage however that they are not suited for modern non-thruplating insertion and soldering methods.

One known method of producing very small terminal groups is based on the use of a tape carrier material (e.g. polyimide), on which a terminal grid is produced by the positive or negative method and in assembly is connected directly to the chip by soldering. The amount of solder necessary for this is applied in a number of additional processes, starting from the chip. With this "tape automated bonding", terminal widths of 50 mm with a spacing of 30 mm, that is a grid pattern of 80 mm, can be realized. However, this method is relatively expensive and inflexible. High tape material and tool costs arise, which have to be funded anew with every change in chip design. Therefore, a cost-effective production of relatively small numbers is not possible. Furthermore, these products require special insertion techniques at the customer's premises.

SUMMARY OF THE INVENTION

One object of the invention is to provide a lead frame of the type mentioned above which is inexpensive to produce and allows for a high number of terminals.

According to the invention, this object is achieved by the metallic conductors being produced in an outer region by a conventional production method and at their ends pointing toward the terminals by laser cutting of uniform metallic material.

According to the invention, for the first time a combination of more than one production method is undertaken for producing the conductors of the lead frame. The invention is based on the realization that the conventional methods are adequate for the larger spacings in the outer region of the lead frames, meaning that the most favorable, usually the least expensive, method is selected for each application. The limitation of the interconnection density is due to the disadvantages of the conventional methods, which do not allow a reduction in the spacing between the terminal ends of the conductors. According to the invention, a laser cutting method is employed at the inner end of the conductor track, so that once the conventional method has been applied to the outer ends of the conductors a uniform metallic surface remains on the inside, which can then be divided by laser cutting into the desired extensions of the conductors produced. Laser cutting is very flexible, but requires a relatively great deal of time. However, the time required is not critical for the production of the lead frame according to the invention, because only the small sections at the inner end of the conductors are produced by laser cutting, while ordinarily the greater length of the conductors is produced by the conventional quick methods, such as punching or etching.

By using laser cutting, it is possible to achieve a spacing between the leads which is smaller than 70% of the material thickness, and possibly as small as 35% or less of the thickness of the leadframe material. This is a marked improvement over conventional lead forming techniques, which achieve a spacing of an absolute minimum or 80% of the material thickness.

BRIEF DESCRIPTION OF THE DRAWINGS

The invention is explained in more detail below with reference to the enclosed drawing, in which.

DETAILED DESCRIPTION OF THE PREFERRED EMBODIMENTS

Figure 1:
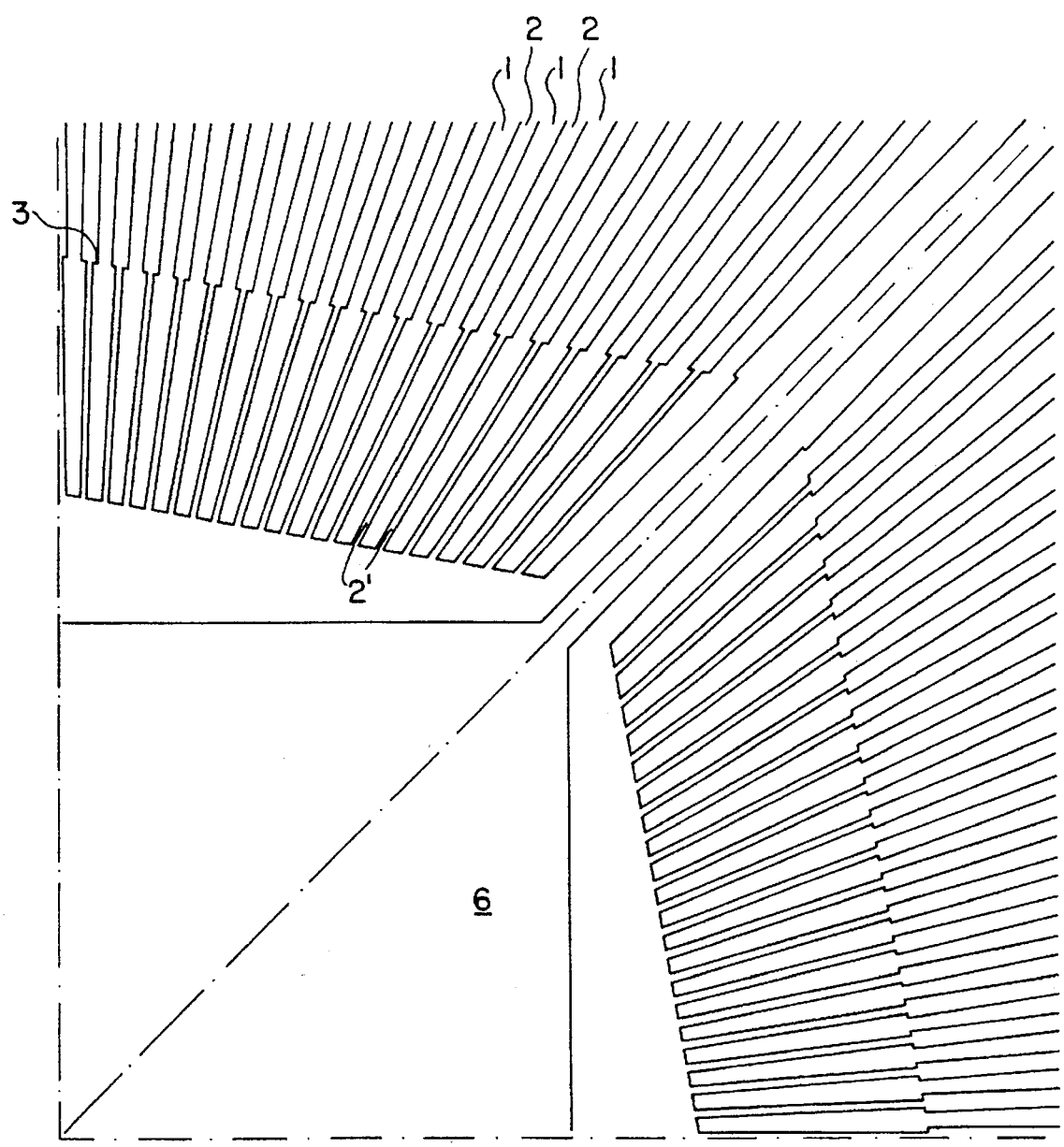
FIG. 1 is a plan view showing conductors of a lead frame according to the invention, which conductors terminate adjacent a bonding pad.

FIG. 1 illustrates a multiplicity of approximately star-shaped metallic conductors or leads 1, which are relatively wide in the outer region of the lead frame and are separated from one another by likewise relatively wide intermediate spaces 2. Contacts can be attached to the conductors 1 at their outer ends by conventional techniques.

Figure 2:
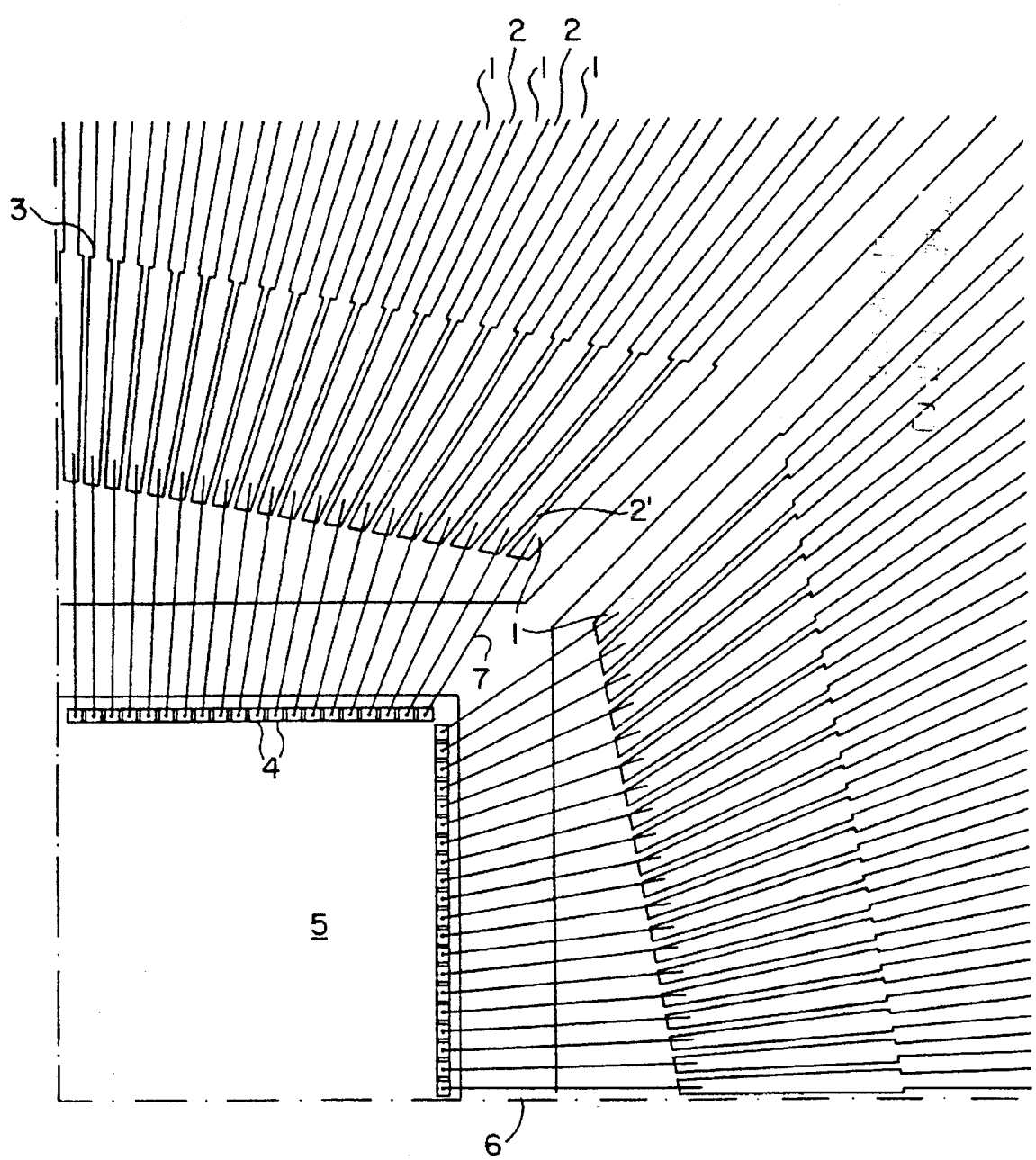
FIG. 2 is a plan view showing the conductors according to FIG. 1 connected by bonding wires to terminal areas of a semiconductor chip.

The conductors 1, the illustrated portions of which may be linear as shown in FIGS. 1 and 2, are produced over a large part of their length by a conventional technique, for example by etching or punching. Where the converging profile of the conductors 1 causes the width of the conductor track to reach a lower acceptable limit on the basis of minimal spacing 2 to be maintained, there is formed in the conductor track 1 a step 3, by which the conductor tracks are widened again and are separated by a very narrow spacing 2' of constant width. The spacings 2' of constant width are produced by laser cutting the originally uniformly formed metallic material within the step 3. Laser cutting allows very small widths of the spacings 2' to be realized, so that the grid spacing of the conductors 1 at the inner end of the lead frame corresponds approximately to the grid dimension of terminals 4 of a semiconductor chip 5 or is only slightly larger. In fact, by using laser cutting, it is possible to achieve a spacing between the leads which is smaller than 70% of the thickness of the uniform metallic material. It has been found that a laser cutting technique can actually produce spacings between leads which is smaller than 50% of the thickness of the material, and can even produce spacings which are less than 35% of the thickness of the material.

The metallic material typically has a thickness of 0.125 mm to 0.15 mm, and the inner spacings are preferably between 0.05 mm and 0.07 mm wide. The width of the outer spacings will vary with the particular application, and are typically between 0.15 mm and 0.3 mm.

FIG. 2 shows a semiconductor chip 5, which is positioned on a bonding pad 6 within the lead frame. The connection of the individual terminal 4 to the metallic conductors 1 is made by usual bonding wires 7.

On account of the small grid spacing arising at the inner end of the conductors due to the small width of the spacings 2', the conductors 1 can be led very closely up to the bonding pad 6, so that a high terminal assignment can be realized with short bonding wires.

What is claimed is:

1. An apparatus, comprising:
   a bonding pad for receiving a semiconductor integrated circuit having a plurality of terminals; and
   a lead frame including a plurality of metallic conductors adapted to be connected to respective ones of the plurality of terminals, the metallic conductors having
   a uniform thickness and, in an inner region adjacent the bonding pad, a spacing between themselves which is no greater than 70% of the uniform thickness; and
   respective longitudinal axes, each of which extends in a single straight line from the inner region to an outer region.

2. The apparatus of claim 1, wherein the uniform thickness ranges from 0.125 mm to 0.15 mm.

3. The apparatus of claim 1, wherein a spacing between the conductors in the outer region ranges from 0.15 mm to 0.3 mm.

4. The apparatus of claim 1, wherein a ratio of a spacing between the conductors in the outer region to the uniform thickness ranges from 1.2 to 2.

5. The apparatus of claim 1, wherein a ratio of a spacing between the conductors in the outer region to the spacing between the conductors in the inner region ranges from 3 to 4.

6. The apparatus of claim 1, wherein longitudinal outside edges of the conductors converge toward the respective longitudinal axes in the inner region and diverge from the respective longitudinal axes in the outer region.

7. The apparatus of claim 1, wherein the spacing in the inner region between pairs of conductors is uniform.

8. The apparatus of claim 1, wherein a spacing in the outer region between pairs of conductors is uniform.

9. The apparatus of claim 1, wherein the longitudinal axes converge towards one another.

10. The apparatus of claim 1, wherein the spacing between the conductors in the inner region ranges from 0.05 mm to 0.07 mm.

11. The apparatus of claim 1, wherein the spacing between the conductors in the inner region is no more than 50% of the uniform thickness.

12. The apparatus of claim 1, wherein the spacing between the conductors in the inner region is no more than 35% of the uniform thickness.

* * * * *